United States Patent [19]

Moyer et al.

[11] Patent Number: 5,061,656
[45] Date of Patent: Oct. 29, 1991

[54] METHOD FOR MAKING A SELF-ALIGNED IMPURITY INDUCED DISORDERED STRUCTURE

[75] Inventors: Curtis D. Moyer, Phoenix; Stephen P. Rogers, Mesa, both of Ariz.

[73] Assignee: Motorola, Inc., Schaumburg, Ill.

[21] Appl. No.: 618,552

[22] Filed: Nov. 27, 1990

[51] Int. Cl.$^5$ .................. H01L 21/20; H01L 21/225
[52] U.S. Cl. .................... 437/127; 437/129; 437/158; 437/160; 437/905; 148/DIG. 31
[58] Field of Search .............. 437/127, 129, 139, 905, 437/160, 161, 158; 148/DIG. 31; 372/45, 48

[56] References Cited

U.S. PATENT DOCUMENTS 4,166,278  8/1979  Susaki et al. .................. 437/905
4,727,556  2/1988  Burnham et al. .................. 372/45

FOREIGN PATENT DOCUMENTS 128481  5/1990  Japan .................. 437/905

Primary Examiner—Brian E. Hearn
Assistant Examiner—Linda J. Fleck
Attorney, Agent, or Firm—Joe E. Barbee

[57] ABSTRACT

A method for making a self-aligned IID structure for an LED (10) is provided. This self-aligned IID structure is accomplished by depositing a dopant layer (17) over the LED structure. A polymeric material is deposited over layer (17). The polymeric layer and dopant containing layer (17) are etched to a predetermined position. The remaining polymeric material is removed from the LED (10) structure. The LED (10) structure is annealed to produce an IID structure by laterally diffusing dopants from layer (17) into at least one side wall of the LED (10).

11 Claims, 1 Drawing Sheet

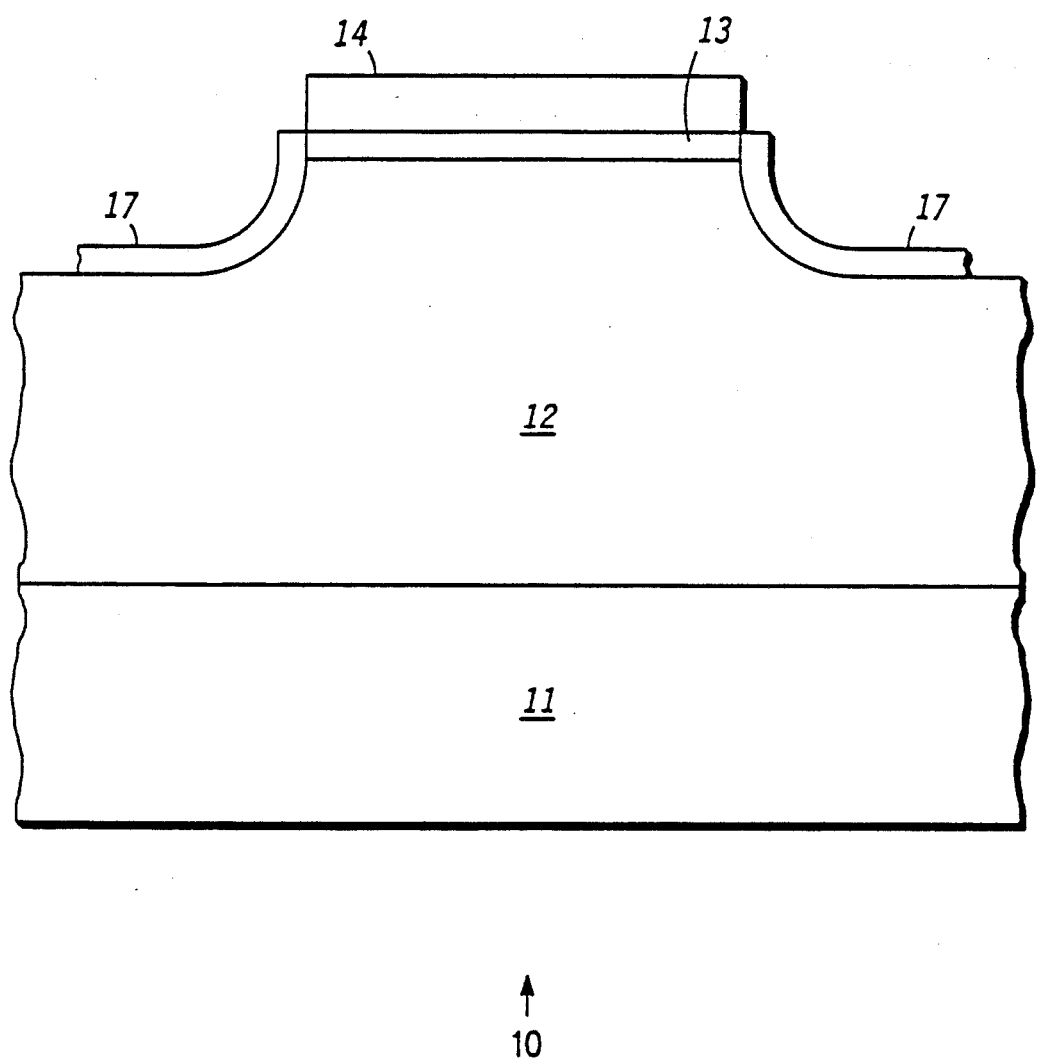

METHOD FOR MAKING A SELF-ALIGNED IMPURITY INDUCED DISORDERED STRUCTURE

BACKGROUND OF THE INVENTION

This invention relates, in general to semiconductors, and more particularly, to a method for making a self-aligned impurity induced disordered (IID) structure for semiconductors.

In III-V compound semiconductor devices such as light emitting diodes (LED), lasers, and heterojunction bipolar transistors, minority carrier confinement and isolation from high recombination surfaces is critical to device performance. An ability to vary band-gaps in III-V compound semiconductor materials such as aluminum gallium arsenide (AlGaAs) by adjusting the aluminum (Al) and gallium (Ga) mole fractions during crystal growth allows for minority carrier confinement in a vertical direction and is a common practice. Minority carrier confinement, however, also needs to be controlled at lateral edges of the semiconductor device. A variety of lateral current confinement approaches such as laterally restricted current injection and multiple epitaxial regrowth processes have been tried to reduce these lateral minority carrier confinement problems. However, laterally restricted current injection does not scale down as lateral active dimensions approach twice a diffusion length of minority carriers ($\sim 10$ microns), and multiple regrowth procedures suffer from process complexity. Additionally, regrowth over a substrate containing a high percentage of aluminum have acute problems due to oxide formation which inhibits epitaxial nucleation. All approaches to date have proved to be unsatisfactory for use in a manufacturing environment.

Work discussed and done by W. D. Laidig, N. Holyonak, Jr., M. D. Camras, K. Hess, J. J. Coleman, P. D. Dapkus, and J. Bardeen, "Disorder of an AlAs-GaAs Super Lattice by Impurity Diffusion," Applied Physics Letters 38 (10), May 15, 1981, pages 776-778 and R. L. Thornton, W. J. Mosby, and H. F. Chung, "Unified Planar Process for Fabricating Heterojunction Bipolar Transistors and Buried-Heterostructure Lasers Utilizing Impurity-Induced Disordering," Applied Physics Letters 53 (26), Dec. 26, 1988, pages 2669-2671 both describe using diffusion of dopants into aluminum gallium arsenide structures. These articles demonstrate that by diffusion of Group IIB and Group IVA, zinc and silicon respectively, into an aluminum gallium arsenide interface or active area allows for the localized interdiffusion of aluminum (Al) and gallium (Ga). A thin active device layer, of typically low Al content, surrounded by cladding layers of typically high Al content, could be converted selectively by a laterally restricted diffusion to a wider band-gap higher Al content material. This process allows the formation of isolated narrow band-gap regions of semiconductor 'active' material to be completely surrounded by single crystal wide band-gap material which forces minority carrier confinement to the narrow band-gap 'active' material and prevents minority carriers from reaching infinite recombination velocity surfaces where they would be lost. This process has been called Impurity Induced Disordering (IID). Typical fabrication of an IID structure has several problems. First, Group IIB and Group IVA dopants are generally diffused from a top surface to an active area which is approximately 1.0 to 2.0 microns in depth or distance. As a result of these long diffusion distances long periods of time at high temperatures are required to drive the Group IIB and Group IVA dopants to a desired depth and location. Second, spreading of the dopants leads to a Gaussian distribution which does not allow accurate alignment of dopants to a selected target area. Therefore, a method that enables a self-aligned lateral diffusion to produce an IID structure that controls lateral minority carrier confinement and isolation of free recombination surfaces is highly desirable.

SUMMARY OF THE INVENTION

The objects and advantages of the present invention are provided by a method for making a self-aligned IID structure for a mesa LED device. This is accomplished by providing an LED structure and depositing a dopant containing material on the LED structure to form a dopant film. A polymeric film is then applied to the LED structure covering the dopant film. The polymeric and dopant films are etched to a depth that is approximately equal to the depth or location of an active area of the LED. Remaining polymeric film is removed from the LED structure. The LED structure is then annealed to produce lateral diffusion from the remaining dopant film.

BRIEF DESCRIPTION OF THE DRAWINGS

A single FIGURE illustrates an enlarged cross-section of a LED that is prepared for lateral diffusion.

DETAILED DESCRIPTION OF THE DRAWINGS

Illustrated in the single drawing is an example of an enlarged cross-section of a LED device 10. LED device 10 is a III-V compound semiconductor tailored so that light is emitted from a p-n junction when a current is made to pass in a forward biased direction. LED devices have been made for a long time. It is not the purpose of this specification to delve deeply into details of each fabrication step used to build LED devices. For purposes of clarity only one LED device is shown but, many more devices could be shown that can make up an array. In a preferred embodiment, this invention is carried out on a wafer having a plurality of devices. It should be understood that other similar structures, such as lasers or the like, can also benefit from this invention.

Semiconductor substrate 11 is made of gallium arsenide and serves as a crystal nucleation site for subsequent deposition of epitaxial layers. Blanket deposition of layers 12, 13, and 14 of semiconductor materials are deposited by epitaxial techniques on substrate 11. Blanket layers 12, 13, and 14 are then patterned, etched, and cleaned by well known methods, to form a mesa structure.

Composition of III-V compound semiconductors, such as AlGaAs, are sometimes denoted with subscripts which indicate their atomic fraction of the total. By way of example, in III-V compound semiconducting crystal materials containing arsenic, arsenic is typically 50% or one half of the crystal with a balance being made up of other materials. These other materials are represented as a 0-1 value indicating their contribution to the other 50% or one half of the total.

Confinement or cladding layer 12 is made of n-type epitaxially deposited aluminium gallium arsenide (AlGaAs). Layer 12 typically has an aluminium (Al) content range of between 0.7 to 0.9 with a gallium content range of between 0.3 to 0.1 ($Al_{0.7-0.9}$ $Ga_{0.3-0.1}$ As).

Active area or layer 13 is made of p-type epitaxially deposited AlGaAs. Active area 13 typically has an Al range of between 0.0 to 0.4, with a gallium content range between 0.6 to 1.0 ($Al_{0.0-0.4}$ $Ga_{0.6-1.0}$ As). Active area 13 is where carriers combine and photons of light are produced.

Confinement or cladding layer 14 is made of p-type epitaxially deposited AlGaAs Confinement layer 14 typically has an Al content range between 0.7 to 0.9 with a gallium content range between 0.3 to 0.1 ($Al_{0.7-0.9}$ $Ga_{0.3-0.1}$ As). It should be understood that other materials for layers 12, 13, and 14 such as aluminium gallium indium phosphide (AlGaInP) or the like can also be used.

A silicon containing layer is deposited over the cleaned mesa structure as a continuous film. The silicon containing layer can be fabricated by several well know methods such as plasma enhanced chemical vapor deposition (PECVD), thermally deposited, E-Beam deposited, or the like. Selection of the silicon containing film and the method in which it is deposited plays a part in how readily silicon (Si) from the silicon containing film is laterally diffused into the mesa structure. Deposition of a very tightly surface bound Si materials such as thermally deposited $Si_3N_4$ in general do not necessarily provide a Si source that is readily diffusible. Further, required use of high temperatures, 600 to 800 degrees Celsius, for deposition of thermal $Si_3N_4$ causes several problems such as outgassing of volatile species in the mesa structure, unintentional diffusion, and reactions other than the primary deposition reaction. In a preferred embodiment, silicon nitride ($Si_3N_4$) is deposited by PECVD or reactively sputtered over the mesa structure. By using PECVD techniques to form the silicon nitride film, high temperature related problems are avoided. Deposition temperatures for PECVD films are typically in a range between 350 to 410 degrees Celsius. PECVD films are generally not as tightly bonded to each other, as well as, to surfaces that they are deposited on. Therefore, PECVD films provide an excellent source of Group IIB and Group IVA dopants that can be diffused laterally into the mesa structure.

Additionally, it should be understood that composition of $Si_3N_4$ films are changeable by adjusting process gas flows. "Silicon rich" or "silicon poor" films are obtained by making gas flow adjustments which change the stoichiometry of the deposited film. Gas flow adjustments allow for either a larger number or a smaller number of silicon atoms that are available to be defused into active area 13.

A polymeric film such as photoresist, polyimide, or the like is then applied over the silicon containing film that covers the mesa structure. A substantially planarized film is thus formed by the polymeric film. Depending upon the height of the mesas further planarizing techniques that re known in the art can be employed to further planarize the polymeric film.

The polymeric film and the nitride layer are then etched, in a blanket manner, to an approximate depth or location of active area 13 of the LED 10. In a preferred embodiment, the polymeric film and silicon containing film 17 are etched by a two step process. The polymeric film is uniformly etched to an approximate depth of that of active area 13 thereby, exposing some of the silicon containing layer while still leaving some of the polymeric material to protect other portions of the silicon containing layer. Unprotected or exposed areas of the silicon containing film are then uniformly etched and removed. After correct etch depth has been obtained the remaining polymeric material is removed. It will be appreciated that a one step etch chemistry could also be used to etch the polymeric and silicon containing layers.

It should be understood that deposition of the dopant film, application of the polymeric film, and the etching of the films are blanket processes. These blanket processes result in having layer 17 precisely positioned for lateral diffusion into walls of the mesa structure. By having layer 17 positioned by deposition and etch procedures without using any masking or patterning techniques, a self-alignment process of layer 17 is accomplished.

LED 10 is then typically exposed to an anneal cycle using an arsine overpressure technique which diffuses Group IIB or Group IVA dopants from layer 17 into walls of the mesa structure. By having layer 17 precisely and accurately position or aligned to active area 13 it is only necessary to diffuse a distance of 0.1 to 0.2 of a micron to produce the desired IID structure. Additionally, a tight distribution of dopant is diffused into active area 13, especially the lateral edges, without using long periods of time at high temperatures. By using this invention annealing cycle times are typically reduced 10 to 20 times from conventional anneal cycle times.

Conventional fabrication of IID structures have demonstrated a problem with unexpected current leakage between the two confinement or cladding layers. It is believed that this problem is caused by inappropriately using a PECVD generated $Si_3N_4$ blanket film or cap as a barrier to outgassing of arsenic from AlGaAs structures during anneal or high temperature steps. Typically, the $Si_3N_4$ film is deposited over an already formed silicon diffusion source material, as well as, being deposited over the entire mesa structure. This structure is then annealed at approximately 850 degrees Celsius which drives the silicon from the already formed silicon source into the AlGaAs to form the IID. The blanket $Si_3N_4$ film or cap does prevent the outgassing of arsenic from the AlGaAs structures during the diffusion cycle. However, not only is silicon diffused from the already formed silicon source but, silicon is also diffused from the $Si_3N_4$ film or cap that covers the mesa structure. The diffusion of silicon from the cap into the entire mesa structure causes a leakage path between the two confinement layers. By using this invention the aforementioned problem or problems would be solved because there is no cap to cause current leakage, the dopant source is precisely aligned so that diffusion is done accurately and fabrication processes are simplified.

By now it should be appreciated that there has been provided a novel method and structure for improving minority carrier confinement and isolation of free surface interactions which is particularly useful for making semiconductor optical devices.

We claim:

1. A method for making a self-aligned impurity induced disordered structure for an LED comprising:
providing an LED structure with a portion of an active area exposed;
depositing a layer of silicon containing material on the LED structure;
applying a polymeric film on the silicon containing material;

etching the polymeric material to a depth that is approximately equal to the height of the portion of the active area and exposing some of the silicon containing material;

etching the exposed silicon containing material to a depth that is approximately equal to that of the polymeric depth;

removing the remaining polymeric material; and performing an annealing step to drive silicon from the layer of silicon containing material into the portion of the active area of the LED structure.

2. The method of claim 1 further including making a multiplicity of LED structures for forming an array.

3. The method of claim 1 further including using plasma enhanced chemical vapor deposition of silicon nitride as a silicon containing layer.

4. The method of claim 1 further including etching the polymeric and silicon containing layer at the same time.

5. The method of claim 1 further including utilizing an arsenic overpressure technique for annealing the LED structure.

6. A method for laterally diffusing a material into a semiconductor mesa structure comprising:

providing a mesa structure with an active area;

depositing the diffusible material on the mesa structure;

applying a planarizing film on the diffusible material;

removing the planarizing material and the diffusible material from the mesa structure to approximately the active area; and exposing the mesa structure to a diffusion cycle.

7. The method of claim 6 further including determining the lateral diffusion point by etching the diffusible material to a predetermined vertical position.

8. The method of claim 6 further including using silicon nitride as a diffusible material.

9. A method for making an IID for a p-n junction comprising:

exposing a p-n junction on a side of a wall;

depositing a dopant containing film over the p-n junction;

applying a planarizing film over the dopant containing film;

etching both the planarizing film and the dopant containing film to near the p-n junction to leave the p-n junction covered by the dopant containing film; and annealing the p-n junction.

10. The method of claim 9 further including using plasma enhanced chemical vapor deposition for depositing the dopant film.

11. The method of claim 10 further including using silicon nitride as the dopant film.

* * * * *